(12) United States Patent
Kaza et al.

(10) Patent No.: US 7,902,086 B2
(45) Date of Patent: Mar. 8, 2011

(54) PREVENTION OF OXIDATION OF CARRIER IONS TO IMPROVE MEMORY RETENTION PROPERTIES OF POLYMER MEMORY CELL

(75) Inventors: Swaroop Kaza, Woburn, MA (US); David Gaun, Brookline, MA (US); Michael A. Van Buskirk, Saratoga, CA (US)

(73) Assignee: Spansion LLC, Sunnyvale, CA (US)

( * ) Notice: Subject to any disclaimer, the term of this patent is extended or adjusted under 35 U.S.C. 154(b) by 970 days.

(21) Appl. No.: 11/608,388

(22) Filed: Dec. 8, 2006

(65) Prior Publication Data

US 2008/0135834 A1 Jun. 12, 2008

(51) Int. Cl.
H01L 21/31 (2006.01)
H01L 21/469 (2006.01)

(52) U.S. Cl. .... 438/780; 257/40; 257/642; 257/E51.017; 257/E21.299; 438/82; 438/99

(58) Field of Classification Search ......... 257/40, 257/642, E51.017, E21.299; 365/114, 115; 438/82, 99, 780; H01L 27/115, 27/28, 51/00
See application file for complete search history.

(56) References Cited

U.S. PATENT DOCUMENTS

| | | | |
|---|---|---|---|
| 4,404,126 A * | 9/1983 | Muench et al. ............... 252/512 |
| 6,656,763 B1 | 12/2003 | Oglesby et al. |
| 6,686,263 B1 | 2/2004 | Lopatin et al. |
| 6,746,971 B1 | 6/2004 | Ngo et al. |
| 6,753,247 B1 | 6/2004 | Okoroanyanwu et al. |
| 6,768,157 B2 | 7/2004 | Krieger et al. |
| 6,770,905 B1 | 8/2004 | Buynoski et al. |
| 6,773,954 B1 | 8/2004 | Subramanian et al. |
| 6,781,868 B2 | 8/2004 | Bulovic et al. |
| 6,787,458 B1 | 9/2004 | Tripsas et al. |
| 6,803,267 B1 | 10/2004 | Subramanian et al. |
| 6,822,031 B2 * | 11/2004 | Tai et al. ....................... 524/398 |
| 6,825,060 B1 | 11/2004 | Lyons et al. |
| 6,852,586 B1 | 2/2005 | Buynoski et al. |
| 6,858,481 B2 | 2/2005 | Krieger et al. |
| 6,864,522 B2 | 3/2005 | Krieger et al. |
| 6,878,961 B2 | 4/2005 | Lyons et al. |
| 6,893,895 B1 * | 5/2005 | Okoroanyanwu et al. ...... 438/99 |
| 6,955,939 B1 | 10/2005 | Lyons et al. |
| 6,977,389 B2 | 12/2005 | Tripsas et al. |
| 6,992,323 B2 * | 1/2006 | Krieger et al. ................. 257/40 |
| 7,067,349 B1 | 6/2006 | Buynoski et al. |
| 7,084,062 B1 | 8/2006 | Avanzino et al. |
| 7,105,374 B1 | 9/2006 | Leonard et al. |
| 7,115,440 B1 | 10/2006 | Lyons et al. |
| 7,129,133 B1 | 10/2006 | Avanzino et al. |
| 7,274,035 B2 * | 9/2007 | Yang et al. ....................... 257/27 |
| 7,659,361 B2 * | 2/2010 | Kozlowski et al. ............ 528/310 |
| 2003/0052336 A1 * | 3/2003 | Yamazaki et al. ............ 257/200 |
| 2004/0026729 A9 * | 2/2004 | Krieger et al. ................ 257/306 |
| 2006/0131569 A1 * | 6/2006 | Choi et al. ..................... 257/40 |
| 2007/0029538 A1 * | 2/2007 | Pinnow ............................ 257/4 |
| 2007/0029546 A1 * | 2/2007 | Cho et al. ........................ 257/40 |

(Continued)

*Primary Examiner* — Asok K Sarkar
(74) *Attorney, Agent, or Firm* — Turocy & Watson, LLP

(57) ABSTRACT

Improving memory retention properties of a polymer memory cell are disclosed. The methods include providing a semiconducting polymer layer containing at least one organic semiconductor and at least one of a carrier ion oxidation preventer and an electrode oxidation preventer. The oxidation preventers may contain at least one of 1) an oxygen scavenger, 2) a polymer with oxidizable side-chain groups which can be preferentially oxidized over the carrier ions/electrodes, and 3) an oxidizable molecule that can be preferentially oxidized over the carrier ions/electrodes.

19 Claims, 5 Drawing Sheets

U.S. PATENT DOCUMENTS

2007/0034865 A1* 2/2007 Yukawa .................... 257/40
2007/0102696 A1* 5/2007 Brown et al. .................... 257/40
2008/0061287 A1* 3/2008 Nagata et al. .................... 257/40
2009/0065769 A1* 3/2009 Yukawa et al. ................. 257/40

* cited by examiner

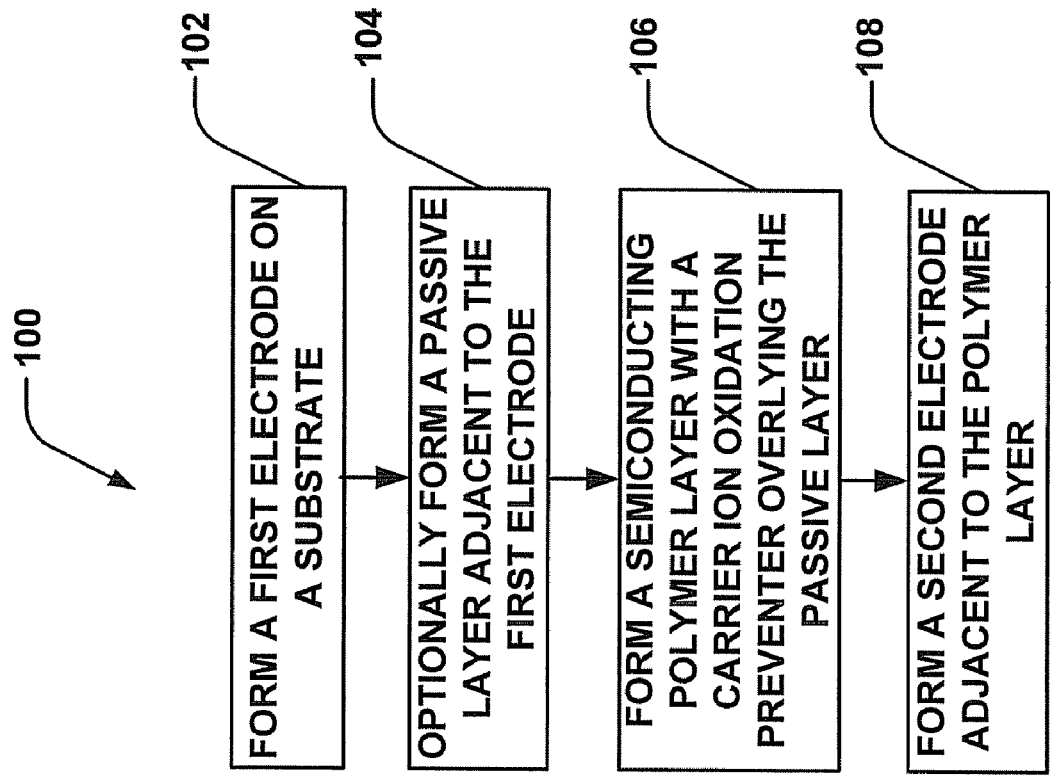

PREVENTION OF OXIDATION OF CARRIER IONS TO IMPROVE MEMORY RETENTION PROPERTIES OF POLYMER MEMORY CELL

TECHNICAL FIELD

The subject invention generally relates to memory cells. More particularly, the subject invention relates to methods for improving memory retention properties of polymer memory cells.

BACKGROUND ART

The basic functions of a computer and memory devices include information processing and storage. In typical computer systems, these arithmetic, logic, and memory operations are performed by devices that are capable of reversibly switching between two states often referred to as "0" and "1." Such switching devices are fabricated from semiconducting devices that perform these various functions and are capable of switching between two states at high speed. Electronic addressing or logic devices, for instance, for storage or processing of data, are made with inorganic solid state technology, and particularly crystalline silicon devices.

Much of the progress in making computers and memory devices faster, smaller and cheaper involves integration, squeezing ever more transistors and other electronic structures onto a postage stamp sized piece of silicon. A postage stamp sized piece of silicon may contain tens of millions of transistors, each transistor as small as a few hundred nanometers. However, silicon based devices are approaching their fundamental physical size limits.

Inorganic solid state devices are generally encumbered with a complex architecture which leads to a high cost and a loss of data storage density. The circuitry of volatile semiconductor memories based on inorganic semiconductor material must constantly be supplied with electric current with a resulting heating and high electric power consumption in order to maintain stored information. Nonvolatile semiconductor devices based on inorganic semiconductor material have a reduced data rate and relatively high power consumption and large degree of complexity.

SUMMARY

The following is a summary of the invention in order to provide a basic understanding of some aspects of the invention. This summary is not intended to identify key/critical elements of the invention or to delineate the scope of the invention. Its sole purpose is to present some concepts of the invention in a simplified form as a prelude to the more detailed description that is presented later.

The subject invention provides methods for improving memory retention properties of a polymer memory cell. More specifically, the semiconducting polymer layer of a polymer memory cell is incorporated with a carrier ion oxidation preventer that can mitigate, prevent, and/or delay at least one of the oxidation carrier ions injected into the semiconducting polymer layer and the oxidation of the electrodes. The subject invention further provides for polymer memory cells and/or devices comprising a substrate, at least two electrodes, one or more passive layers, and a semiconducting polymer layer containing one or more semiconducting polymers and a carrier ion oxidation preventer. The subject invention, by facilitating the extension of polymer memory retention time, increases the usefulness of polymer memory for use in microelectronic devices.

One aspect of the subject invention relates to methods that mitigate, prevent, and/or delay at least one of the oxidation of carrier ions injected into a semiconducting polymer layer of a polymer cell/device and the oxidation of one or both electrodes. The methods include incorporation of a carrier ion oxidation preventer into the semiconducting polymer layer of a polymer memory cell/device. In one embodiment, atoms, nanoparticles, molecules or compounds of an oxygen scavenger can be incorporated into the semiconducting polymer layer. In another embodiment, the semiconducting polymer layer can include one or more semiconducting polymers and an oxidizable compound. In yet another embodiment, the semiconducting polymer layer can include at least one polymer with oxidizable side-chain groups. Prevention of oxidation of carrier ions permits extension of duration of memory retention of a polymer memory cell in a reliable and efficient manner. Moreover, prevention of oxidation of one or both electrodes permits extension of duration of memory retention of a polymer memory cell in a reliable and efficient manner.

Another aspect of the subject invention relates to providing a polymer memory device containing at least one polymer memory cell made of two electrodes, one or more passive layers, and a semiconducting polymer layer between two electrodes, the semiconducting polymer layer containing one or more semiconducting polymers and at least one carrier ion oxidation preventer.

To the accomplishment of the foregoing and related ends, the invention comprises the features hereinafter fully described and particularly pointed out in the claims. The following description and the annexed drawings set forth in detail certain illustrative aspects and implementations of the invention. These are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF DRAWINGS

FIG. 1 illustrates a flow diagram of an exemplary methodology for mitigating, preventing and/or delaying oxidation of copper ions in the semiconducting polymer layer of a polymer memory cell according to one aspect of the present invention.

DETAILED DESCRIPTION

Figure 4:
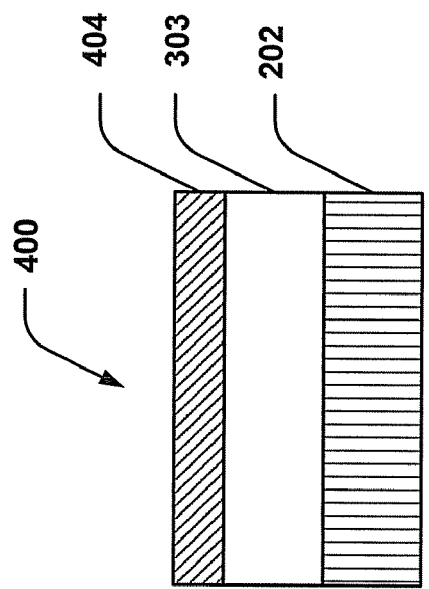
FIGS. 2-6 illustrate a cross-sectional view of a polymer memory cell in various states of manufacture in accordance with the methodology described in FIG. 1.

The subject invention involves a method for mitigating, preventing, and/or delaying oxidation of carrier ions injected into the semiconducting polymer layer of a polymer memory cell from a passive layer or one of the electrodes. Alternatively or additionally, the subject invention involves a method for mitigating, preventing, and/or delaying oxidation of one or both of the electrodes.

The method includes forming a first electrode over a substrate, optionally forming a passive layer adjacent to the first electrode, and forming a semiconducting polymer layer comprising one or more semiconducting polymers and a carrier ion oxidation preventer. Examples for the carrier ion oxidation preventer include: 1) a polymer with oxidizable side-chain groups, 2) an oxygen scavenger, 3) an oxidizable compound, and 4) an antioxidant. The carrier ion oxygen preventer permits mitigating, preventing, and/or delaying of the oxidation of carrier ions injected into the semiconducting polymer layer and/or delaying of the oxidation of the electrodes.

Optionally, the methods permit forming additional layers, such as additional electrodes, charge retention layers, and/or chemically active layers. The semiconducting polymer layer and the optional passive layer together constitute a controllably conductive media, which is responsible for conductive properties of polymer memory cell. The controllably conductive media may contain a semiconducting polymer layer alone or a semiconducting polymer layer and a passive layer. The impedance of the controllably conductive media changes when an external stimulus such as an applied electric field is imposed. A plurality of polymer memory cells, which may be referred to as an array, form a polymer memory device.

Examples of active polymer memory devices include semiconducting polymer transistors, nonvolatile polymer memory cells, programmable polymer memory cells, and the like. The polymer cells described herein can be employed with logic devices such as central processing units (CPUs); as volatile memory devices such as DRAM devices, as SRAM devices, and the like; with input/output devices (I/O chips); and as non-volatile memory devices such as EEPROMs, EPROMs, PROMs, and the like.

In polymer memory cells, the conductance/resistance of a semiconducting polymer in response to an electric field represents memory. Therefore, retention of a given conductivity status is crucial for memory retention. The memory retention properties of a polymer memory cell depend on factors such as stability of carrier ions injected into the semiconducting polymer layer both when the memory cell is exposed to an electric field and also when the memory cell is shut down. In cases where the optional passive layer (superionic layer) or electrodes of a polymer memory contain copper and/or compounds containing copper, the copper ions constitute carrier ions. These copper ions contribute to the conductivity of the semiconducting polymer layer. However, copper ions are susceptible to oxidation in the semiconducting polymer layer, and oxidation of copper ions alters conductivity characteristics of the polymer cell, and thereby influences memory retention times of a polymer cell. Therefore, oxidation of copper ions is a concern in achieving relatively high memory retention times in polymer memory cells. Although not wishing to be bound by any theory, it is believed that the subject invention, by providing a semiconducting polymer layer with a carrier ion oxidation preventer, mitigates, prevents, and/or delays the undesirable oxidation of carrier ions injected into the semiconducting polymer layer. For instance, the incorporation of oxygen scavengers into a semiconducting polymer layer is believed to deplete/neutralize oxygen and oxygen radicals, thereby extending the duration of carrier ions in the semiconducting polymer layer. In addition, the incorporation of polymers containing oxidizable side-chain groups into a semiconducting polymer layer is believed to prevent and/or delay oxidation of carrier ions injected into the semiconducting polymer layer by competing with carrier ions for undergoing oxidation. Similarly, a semiconducting polymer layer with antioxidants or compounds which are more readily oxidizable than the carrier ions, is believed to delay oxidation of carrier ions and thereby extend the duration of memory retention.

As noted above, the conductance/resistance of a semiconducting polymer memory cell and the retention of a given conductivity status is crucial for memory retention. The memory retention properties of a polymer memory cell depend on factors such as the conductivity of the electrodes of the memory cell. The electrodes contribute to the conductivity of the semiconducting polymer memory cell. However, one or both electrodes are susceptible to oxidation, and oxidation of one or both electrodes alters the conductivity characteristics of the polymer cell, and thereby influences memory retention times of a polymer memory cell. Therefore, oxidation of one or both electrodes is a concern in achieving relatively high memory retention times in polymer memory cells. Although not wishing to be bound by any theory, it is believed that the subject invention, by providing a semiconducting polymer layer with a carrier ion oxidation preventer, mitigates, prevents, and/or delays the undesirable oxidation of one or both electrodes of the polymer memory cell. For instance, the incorporation of oxygen scavengers into a semiconducting polymer layer is believed to deplete/neutralize oxygen and oxygen radicals, thereby preventing corrosion of the electrodes.

The subject invention may be understood and its advantages appreciated in conjunction with figures and drawings, wherein like numerals represent like features throughout. It be understood that the description of these embodiments are merely illustrative and they should not be taken in a limiting sense.

The embodiments of an apparatus or method described herein can be manufactured in a number of different positions and orientations. The term "carrier ion oxidation preventer" refers to any material which reacts with oxygen, an inhibitor which prevents a reaction with oxygen, any material which can 1) prevent and/or delay oxidation of carrier ion(s) or carrier charge(s) and/or 2) prevent and/or delay oxidation of one or both electrodes. Examples of the carrier ion oxidation preventer include atoms, nanoparticles, molecules, compounds, or combinations thereof. The carrier ion oxidation preventer refers to oxygen scavengers, oxygen scavenging material, oxidizable compounds. The term oxidizable compound refers to molecules, compounds, polymers and substances that have the capacity to undergo oxidation and include monomeric compounds, polymers, polymers with oxidizable side-chain groups, oxidizable polymers, and the like. The terms passive layer, superionic layer, and conductivity facilitating layer can be used interchangeably and have the same meaning. The terms semiconducting polymer and polymer semiconductor have the same meaning in the context of the present invention. The term "carrier ion" in the context of the subject invention includes charges, ions, electrons, holes, and the like.

Referring to FIG. 1, a flow diagram of a method for preventing oxidation of carrier ions in the semiconducting polymer layer of a polymer memory cell according to one aspect of the subject invention is illustrated. For simplicity of explanation, the methodology is depicted and described as a series of acts. It is to be understood and appreciated that the subject invention is not limited by the acts illustrated and/or by the order of acts, for example acts can occur in various orders and/or concurrently, and with other acts not presented and described herein. Furthermore, not all illustrated acts may be required to implement the methodologies in accordance with the subject invention. In addition, those skilled in the art will understand and appreciate that the methodologies could alternatively be represented as a series of interrelated states via a state diagram or events.

The method 100 involves forming a first electrode layer on a substrate (act 102), optionally forming a passive layer adjacent to the first electrode (optional act 104), forming a semiconducting polymer layer with at least one semiconducting polymer and a carrier ion oxidation preventer over the optional passive layer (act 106), and forming a second electrode over the semiconducting polymer layer (act 108). In the event that the optional passive layer is not formed adjacent to the first electrode, then the semiconducting polymer layer with at least one semiconducting polymer and a carrier ion oxidation preventer is formed over the first electrode.

Figure 2:
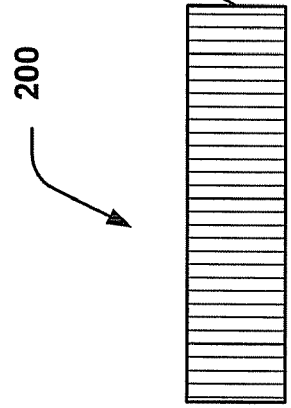

FIGS. 2-6 illustrate a polymer memory cell in various states of manufacture in accordance with the methodology described in FIG. 1. FIG. 2 is a cross-sectional illustration of a polymer memory cell 200 on a substrate 202 utilized to perform the methodology described in FIG. 1. The substrate 202 can be any substrate used in the course of semiconductor processing or any semiconductor surfaces. The substrate 202 is formed or provided using methods known to one skilled in the art. Typically, the substrate 202 is a silicon substrate, optionally with various elements and/or layers thereover; including metal layers, barrier layers, dielectric layers, device structures, active elements and passive elements including polysilicon gates, wordlines, source regions, drain regions, bit lines, bases, emitters, collectors, conductive lines, conductive plugs, etc.

Figure 3:
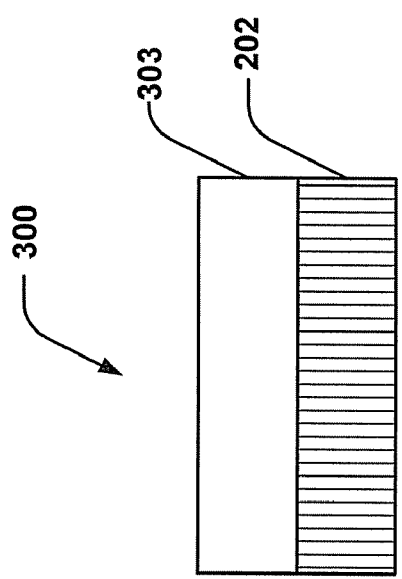

Act 102 of the method 100 is forming a first electrode on the substrate 202. FIG. 3 is a cross-sectional illustration of a polymer memory cell 300 showing the first electrode 303 over the substrate 202. The first electrode 303 is formed using methods known to one skilled in the art. For example, the first electrode 303 is formed by depositing metals using techniques such as etching, evaporation, physical vapor deposition (PVD), chemical vapor deposition (CVD) and plasma enhanced chemical vapor deposition (PECVD).

The first electrode 303 may or may not cover the entire surface of the substrate 202. The first electrode 303 is made of conductive material, such as a conductive metal, conductive metal alloys, conductive metal oxides, conductive polymer films, semiconductive materials, and the like. Specific examples of materials for the first electrode 303 include one or more of aluminum, chromium, copper, germanium, gold, magnesium, manganese, indium, iron, nickel, palladium, platinum, silver, titanium, zinc, and alloys thereof; indium-tin oxide (ITO); polysilicon; doped amorphous silicon; metal silicides; and the like. Alloy electrodes specifically include Hastelloy®, Kovar®, Invar, Monel®, Inconel®, brass, stainless steel, magnesium-silver alloy, and various other alloys.

The thickness and width of the first electrode 303 may depend upon the specific lithography and design rules. In one embodiment, the thickness of the first electrode 303 is about 0.01 μm or more and about 10 μm or less. In another embodiment, the thickness of the first electrode 303 is about 0.05 μm or more and about 5 μm or less. In yet another embodiment, the thickness of the first electrode 303 is about 0.1 μm or more and about 1 μm or less.

The position of the first electrode 303 is not critical for the present invention and one skilled in the art would recognize that the first electrode can be placed in a variety of positions without losing the advantages of the present invention.

Optional act 104 of the method 100 is forming of an optional passive layer. FIG. 4 is a cross-sectional illustration of a polymer memory cell 400 showing the substrate 202, the first electrode 303 and an optional passive layer 404. The passive layer 404 is formed adjacent to the first electrode 303. The passive layer 404 can be made of at least one conductivity facilitating compound. Examples of conductivity facilitating compounds that may constitute the passive layer 404 include one or more of copper sulfide ($Cu_2S$, $CuS$), copper rich copper sulfide ($Cu_3S$, $CuS$; $Cu_3S$, $Cu_2S$), copper oxide ($CuO$, $Cu_2O$), copper selenide ($Cu_2Se$, $CuSe$), copper telluride ($Cu_2Te$, $CuTe$), manganese oxide ($MnO_2$), titanium dioxide ($TiO_2$), indium oxide ($I_3O_4$), silver sulfide ($Ag_2S$, $AgS$), gold sulfide ($Au_2S$, $AuS$), iron oxide ($Fe_3O_4$), cobalt arsenide ($CoAs_2$), nickel arsenide ($NiAs$), and the like. The conductivity facilitating compounds do not necessarily dissociate into ions under the strength of the electric field, although ions may move through them. The passive layer 404 may contain two or more subpassive layers, each sublayer containing the same, different, or multiple conductivity facilitating compounds.

The passive layer 404 is grown using oxidation techniques, formed via gas phase reactions, implantation techniques, or deposited on/between electrodes. In some instances, the passive layer 404 may be treated with a plasma after it is formed. The plasma treatment modifies the energy barrier of the passive layer 404.

In one embodiment, the passive layer 404 containing the conductivity facilitating compound has a thickness of about 2 Å or more and about 0.1 μm or less. In another embodiment, the passive layer 404 has a thickness of about 10 Å or more and about 0.01 μm or less. In yet another embodiment, the passive layer 404 has a thickness of about 50 Å or more and about 0.005 μm or less.

Figure 5:
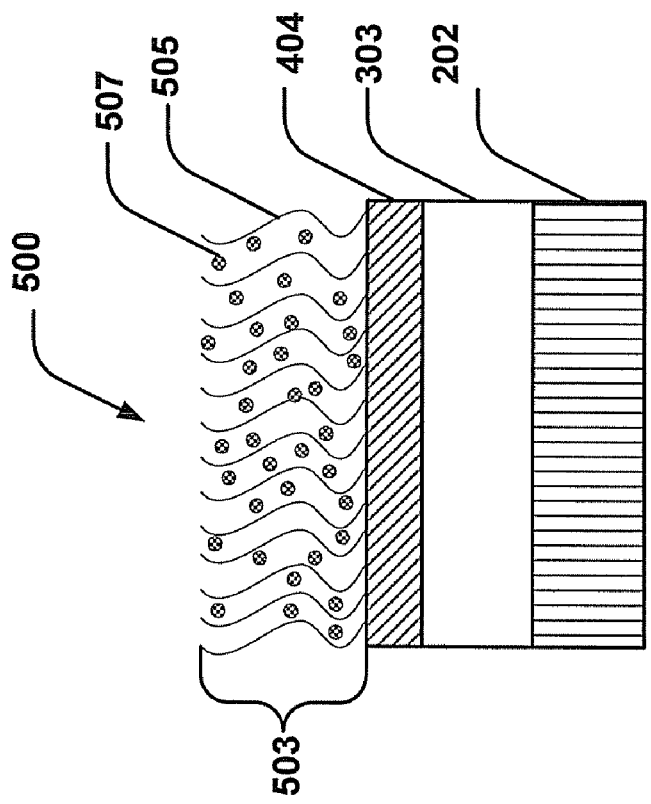

Act 106 of the method 100 is forming of a semiconducting polymer layer. FIG. 5 is a cross-sectional illustration of a polymer memory cell 500 undergoing act 106, showing the substrate 202, the first electrode layer 303, the optional passive layer 404, and a semiconducting polymer layer 503 containing a semiconducting polymer 505 and a carrier ion oxidation preventer 507. The semiconducting polymer layer 503 of the subject invention can contain at least one semiconducting polymer 505 and at least one carrier ion oxidation preventer 507.

The semiconducting polymer 505 of act 106 can be formed by spin-on techniques (depositing a mixture of the polymer/polymer precursor and a solvent, then removing the solvent from the substrate/electrode), by chemical vapor deposition (CVD) optionally including a gas reaction, gas phase deposition, and the like. CVD includes low pressure chemical vapor deposition (LPCVD), plasma enhanced chemical vapor deposition (PECVD), and high density chemical vapor deposition (HDCVD). During formation or deposition, the polymer material may self assemble between the electrodes/passive layer. It is not typically necessary to functionalize one or more ends of the organic polymer in order to attach it to an electrode/passive layer. When the optional passive layer 404 is present, the semiconducting polymer layer 503 is formed over the passive layer 404. When the optional passive layer 404 is not present, the semiconducting polymer layer 503 is formed over the first electrode layer 303.

The semiconducting polymer 505 can be one or more semiconducting polymers. Examples of semiconducting polymers which can be used as polymer 505 include conjugated organic polymers, organometallic polymers, carbon structures such as carbon nanotubes and buckyballs, and the like.

A carbon nanotube is typically a hexagonal network of carbon atoms that is rolled up into a seamless cylinder. Each end may be capped with half of a fullerene molecule. Carbon nanotubes may be prepared by the laser vaporization of a carbon target (a cobalt-nickel catalyst may facilitate growth) or a carbon-arc method to grow similar arrays of single-wall nanotubes. A buckyball is more specifically a Buckminsterfullerene, a soccerball-shaped 60-atom or 70-atom cluster of pure carbon.

The organic polymer typically contains a conjugated organic polymer. The polymer backbone of the conjugated organic polymer extends lengthwise between the electrodes. The conjugated organic polymer may be linear or branched, so long as the polymer retains its conjugated nature. Conjugated polymers are characterized in that they have overlapping π orbitals. Conjugated polymers are also characterized in that they may assume two or more resonant structures. The conjugated nature of the conjugated organic polymer contributes to the controllably conductive properties of the controllably conductive media.

In this connection, the semiconducting polymer, such as a conjugated organic polymer, has the ability to donate and accept charges (holes and/or electrons). Generally, the semiconducting polymer or an atom/moiety in the polymer has at least two relatively stable states. The two relatively stable oxidation states permit the semiconducting polymer to donate and accept charges and electrically interact with the conductivity facilitating compound. The ability of the semiconducting polymer layer to donate and accept charges and electrically interact with the passive layer also depends on the identity of the conductivity facilitating compound.

The organic polymers (or the organic monomers constituting the organic polymers) may be cyclic or acyclic. During formation or deposition, the organic polymer self assembles between the electrodes. Examples of conjugated organic polymers include one or more of poly(p-phenylene vinylene); polyporphyrins; porphyrinic macrocycles, thiol-derivatized polyporphyrins; polymetallocenes such as polyferrocenes, polyphthalocyanines; polyvinylenes; polystiroles; polyacetylene; polydiphenylacetylene; poly(t_butyl)diphenylacetylene; poly(trifluoromethyl)diphenylacetylene; polybis(trifluoromethyl)acetylene; polybis(t_butyldiphenyl)acetylene; poly(trimethylsilyl)diphenylacetylene; poly(carbazole)diphenylacetylene; polydiacetylene; polyphenylacetylene; polypyridineacetylene; polymethoxyphenylacetylene; polymethylphenylacetylene; poly(t-butyl)phenylacetylene; polynitro-phenylacetylene; poly(trifluoromethyl)phenylacetylene; poly(trimethylsilyl)pheylacetylene; polydipyrrylmethane; polyindoqiunone; polydihydroxyindole; polytrihydroxyindole; furane-polydihydroxyindole; polyindoqiunone-2-carboxyl; polyindoqiunone; polybenzobisthiazole; poly(p-phenylene sulfide); polyaniline; polythiophene; polypyrrole; polysilane; polystyrene; polyfuran; polyindole; polyazulene; polyphenylene; polypyridine; polybipyridine; polyphthalocyanine; polysexithiofene; poly(siliconoxohemiporphyrazine); poly(germaniumoxohemiporphyrazine); poly(ethylenedioxythiophene); polymetallocene complexes (Fe, V, Cr, Co, Ni and the like); polypyridine metal complexes (Ru, Os and the like); and the like.

The carrier ion oxidation preventer 507 of the subject invention can be incorporated into the semiconducting polymer layer 503 in any suitable manner. Examples of ways in which carrier ion oxidation can be incorporated include co-polymerization of semiconducting polymer and carrier ion oxidation preventer, addition of a carrier ion oxidation preventer during polymerization of semiconducting polymer, implantation of a carrier ion oxidation preventer, diffusion into the semiconducting polymer, and the like. Optionally, a carrier ion oxidation preventer can be modified and/or activated using chemical or light sources after incorporation.

The carrier ion oxidation preventer 507 can be incorporated into the semiconducting polymer layer 503 before, after, or during the formation of semiconducting polymer 505. For example, a carrier ion oxidation preventer can be incorporated at the same time as the semiconducting polymer 505 is being assembled. This can be achieved by adding an appropriate form of carrier ion oxidation preventer to the reaction mixture containing the precursors for the semiconducting polymer 505.

In another instance, the carrier ion oxidation preventer can be incorporated into the semiconducting polymer layer 503 by doping techniques such as implantation and diffusion. In one example, the appropriate form of the carrier ion oxidation preventer is bombarded onto the semiconducting polymer layer 505 using a suitable implantation apparatus.

The carrier ion oxidation preventer 507 can be any material which can prevent and/or delay the oxidation of carrier ions injected into the semiconducting polymer layer during the operation of a polymer memory cell/device. Examples of the carrier ion oxidation preventer 507 include oxygen scavengers, oxidizable compounds, anti-oxidants, and the like.

The carrier ion oxidation preventer 507 can be in any form. For example, the carrier ion oxidation preventer may be an atom, a nanoparticle, an element, a compound, a polymer, or combinations thereof. The carrier ion oxidation preventer 507 can be incorporated as a gas, plasma, solution, ions, and the like.

The semiconducting polymer layer 503 can be of any suitable thickness. In one embodiment, the semiconducting polymer layer 503 has a thickness of about 0.001 µm or more and about 5 µm or less. In another embodiment, the semiconducting polymer layer 503 has a thickness of about 0.01 µm or more and about 2.5 µm or less. In yet another embodiment, the semiconducting polymer layer 503 has a thickness of about 0.05 µm or more and about 1 µm or less.

The carrier ion oxidation preventer 507 can either be uniformly distributed in the semiconducting polymer layer 503 or distributed preferentially in certain locations of the semiconducting polymer layer 503. For example, the carrier ion oxidation preventer 507 can be distributed preferentially (relatively higher concentrations) in locations of the semiconducting polymer layer 503 adjacent the optional passive layer 404 and/or adjacent the electrodes.

The amount of the carrier ion oxidation preventer 507 can be any amount, which brings about desired mitigation, prevention and/or delay of oxidation of carrier ions in the semiconducting polymer layer 503, with the proviso that the carrier ion oxidation preventer does not alter the desired features of semiconducting polymer. In one embodiment, the polymer layer 503 contains from about 0.001 to about 10% by weight of the carrier ion oxidation preventer 507 and from about 99.999 to about 90% by weight of the semiconducting polymer 505. In another embodiment, the polymer layer 503 contains from about 0.01 to about 1% by weight of the carrier ion oxidation preventer 507 and from about 99.99 to about 99% by weight of the semiconducting polymer 505.

In one embodiment, the carrier ion oxidation preventer 507 is an oxygen scavenger. The oxygen scavenger can be any scavenger known in the art to scavenge oxygen. Both organic and inorganic oxygen scavengers can be used.

In one embodiment, the oxygen scavenger is any metal complex exhibiting oxygen scavenging activity. Examples include complexes containing one or more of aluminum, aluminum ferrosilicon, antimony, beryllium, calcium silicon, cerium, cobalt, gallium, hafnium, iron, magnesium alloy, nickel catalyst, selenium, silicon, silver, strontium, titanium, zinc, and/or zirconium.

In yet another embodiment, one or more elements from Group IA of the periodic table and their alloys and compounds may be used as oxygen scavengers. Examples of Group IA elements include cesium, lithium, potassium, sodium. Further examples of inorganic oxygen scavengers include one or more of sodium azide ($NaN_3$), sodium sulfite ($Na_2So_3$), hydrazine, and hydroxylamine.

In one embodiment, the oxygen scavenger is an organic compound. Examples include one or more of the polyterpenes, ascorbic acid, amino polycarboxylic acid, cyclohexanedione, tetramethyl piperidone, and heterocyclic compounds with N-substituted amino groups.

The oxygen scavenger can be incorporated into the polymer in any suitable form. Forms of oxygen scavengers which can be used for incorporation include atoms, elements, molecules, nanoparticles, compounds and combinations thereof. In one embodiment, nanoparticles of lithium metal are incorporated into the semiconducting polymer layer 503. The nanoparticles of lithium can be of any suitable size. In one example, the diameter of the nanoparticles of lithium are from about 1 nm to about 500 nm. In another example, the diameter of the nanoparticles of lithium are from about 10 nm to about 250 nm. The nanoparticles of oxygen scavengers including lithium nanoparticles can be obtained either commercially or made using techniques well known to one skilled in the art. In another embodiment, the oxygen scavenger is in the form of atoms. For example, atoms of lithium can be used as oxygen scavenger.

The oxygen scavenger can be incorporated into the semiconducting polymer layer 503 by any suitable technique, such as, for example, by one or more of doping, diffusion, and implantation. In one embodiment, the oxygen scavenger is incorporated into the semiconducting polymer layer 503 by adding the oxygen scavenger to the reaction mixture containing the precursors for the semiconducting polymer 505. In another embodiment, the oxygen scavenger is incorporated into the semiconducting polymer layer by diffusion after the formation of the semiconducting polymer 505. In one instance, lithium is implanted into the semiconducting polymer 505.

The oxygen scavenger is generally present in an amount sufficient to prevent and/or delay the oxidation of carrier ions injected into the semiconducting polymer layer 503 for a desired duration. The amount of oxygen scavenger employed can vary broadly depending on the desired memory retention characteristics and the effect on polymer conductivity. In one embodiment, the polymer layer 503 contains from about 0.001 to about 10% by weight of the oxygen scavenger and from about 99.999 to about 90% by weight of the semiconducting polymer 505. In another embodiment, the polymer layer 503 contains from about 0.01 to about 1% by weight of the oxygen scavenger and from about 99.99 to about 99% by weight of the semiconducting polymer 505. In a further embodiment, the amount of oxygen scavenger material incorporated is sufficient to increase the memory retention time of polymer memory cell from about one hour to about 2 days.

In another aspect of the subject invention, the carrier ion oxidation preventer 507 is an oxidizable compound. The oxidizable compound of the subject invention can be any compound which can undergo oxidation preferentially over carrier ions injected into the semiconducting polymer layer 503 during the operation of a polymer cell/device. For example, oxidizable compounds can be both organic and inorganic compounds.

In one embodiment, the oxidizable compound comprises an inorganic compound. Examples of inorganic oxidizable molecules include ammonium bisulfite, ammonium sulfite, ammonium thiosulfate, arsenic sulfide, arsenic trisulfide, calcium dithionite, chromous chloride, ferrous chloride, ferrous oxalate, and the like. Other examples include sulfur dioxide, sodium sulfite, sodium metabisulfite, anhydrous sodium bisulfite, potassium metabisulfite, anhydrous potassium bisulfite, and mixtures of these agents. Some more examples of inorganic oxidizable compounds include hydrides of lithium (ex. Lithium aluminum hydride), boron (sodium borohydride), diboranes. It is to be noted that some of these compounds can also be used as oxygen scavengers as discussed above.

In another embodiment, the oxidizable compound is an organic compound. Examples of organic compounds include ascorbic acid, Grignard reagents, organic polymers with oxidizable side-chain groups, oxidizable polymers, and the like. The polymers with oxidizable side-chain groups bind oxygen through oxidation of the polymer chain or pendulant groups.

In one embodiment, polymers containing aliphatic unsaturated hydrocarbons may be used as oxidizable polymers. Examples of oxidizable polymers with unsaturated hydrocarbons include polybutadiene, polyisoprene, styrene-butadiene block copolymers, polyterpenes, poly(meta-xyleneadipamide), polymers of fatty acids such as oleic, ricinoleic, dehydrated ricinoleic, and linoleic acids and esters of such acids, acrylates which can be prepared by transesterification of poly (ethylene-methyl acrylate) such as poly(ethylene-methyl acrylate-benzyl acrylate), poly(ethylene-methyl acrylate-tetrahydrofurfuryl acrylate), poly(ethylene-methyl acrylate-nopol acrylate) and mixtures thereof.

In another embodiment, the oxidizable compounds are polymers with oxidizable side-chain groups. Examples of polymers with an oxidizable side-chain group include polymers and copolymers containing esters, carboxylic acids, aldehydes, ethers, ketones, alcohols, peroxides, and/or hydroperoxides.

In yet another aspect of the subject invention, the carrier ion oxidation preventer 507 is an antioxidant. The term antioxidant refers to a molecule that, at lower concentration than an oxidizable substrate, prevents or delays its oxidation. Examples of antioxidants include sulfur dioxide, trihydroxy butyrophenone, butylated hydroxy toluene, butylated hydroxy anisole, and mercaptopropionyl glycine. Antioxidant is incorporated into the semiconducting polymer 505 by using suitable methods as described earlier.

Though, we have described carrier ion oxidation preventers as distinct oxygen scavengers, oxidizable compounds, polymers with oxidizable compounds or antioxidants, it should be understood that there is a significant overlap between different types of carrier ion oxidation preventers described in the present invention. For example, an oxygen scavenger can also be an oxidizable compound. In another example, a polymer with an oxidizable group can be also be used as an oxidizable compound, oxygen scavenger, and antioxidant interchangeably.

Figure 6:
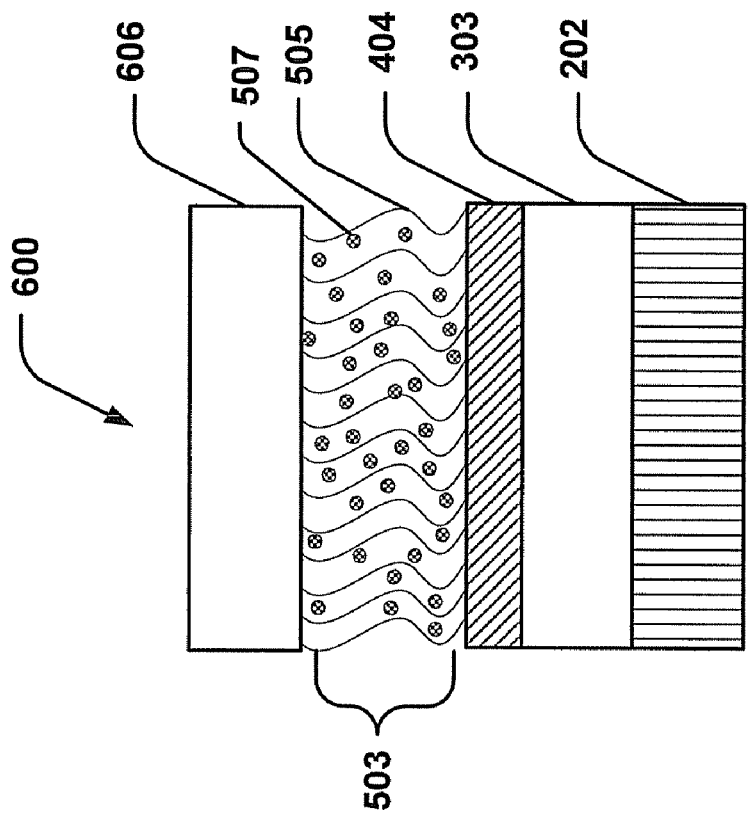

Act 108 of the method 100 is forming a second electrode. FIG. 6 is a cross-sectional illustration of a polymer cell 600 undergoing the formation of the second electrode 606. The second electrode 606 is formed overlying the semiconducting polymer layer 503. The second electrode 606 may be formed in a similar way as that of the first electrode 303, or in a manner different from that of the first electrode 303. In one embodiment, the second electrode 303 comprises copper and/or copper containing compounds. In another embodiment, the second electrode may not contain copper and/or copper containing compounds.

After the formation of the second electrode 606, further processing may be carried out on polymer cell/device 600 to achieve a desired pattern and interconnects using techniques well known to a person skilled in the art.

The optional passive layer 404 may in some instances, when present, act as a catalyst when forming the semiconducting polymer layer 503, particularly when the semiconducting polymer layer 503 contains a conjugated organic polymer. In this connection, the polymer backbone of the conjugated organic polymer may initially form adjacent to the passive layer (on the side opposite the copper containing electrode), and grow or assemble away substantially perpendicular to the passive layer surface.

A covalent bond may be formed between the semiconducting polymer material 505 and the passive layer 404 or between the semiconducting polymer material 505 and the first electrode. Alternatively, close contact is required to provide good charge carrier/electron exchange between the semiconducting polymer layer 503 and the optional passive layer 404. The semiconducting polymer layer 503 and the passive layer 404 when present are electrically coupled in that charge carrier/electron exchange occurs between the two layers. Optionally, before forming the passive layer 404, the first electrode 303 may be treated to improve the contact between the passive layer 404 and the first electrode 303. Optionally, before forming the semiconducting polymer layer 503, the first electrode 303 may be treated to improve the contact between the semiconducting polymer layer 503 and the first electrode 303.

The method 100 is described only as an exemplary embodiment, and it should be noted that a person skilled in the art would appreciate that the advantages of the subject invention can be achieved by modifying and changing the way the method 100 is carried out. For example, it is possible to use more than two electrodes and still maintain the advantages of the subject invention. Similarly, the number and placement of passive layers, semiconducting polymer layers, electrodes, and substrate can be modified while maintaining the advantages of the present invention.

The semiconducting polymer layer 503 can change an impedance state (e.g., from a high resistance to a low resistance) when subject to a stimulus such as a voltage or current due to ionic transport. The polymer semiconductors 505 have a carbon based structure, often a carbon-hydrogen based structure. The semiconducting polymer materials are typically characterized in that they have overlapping $\pi$ orbitals, and/or in that they have at least two stable oxidation states. The semiconducting polymer materials are also characterized in that they may assume two or more resonant structures. The overlapping $\pi$ orbitals contribute to the controllably conductive properties of the controllably conductive media. The amount of charge injected into the semiconducting polymer layer 503 also influences the degree of conductivity of the semiconducting polymer layer 503.

Figure 7:
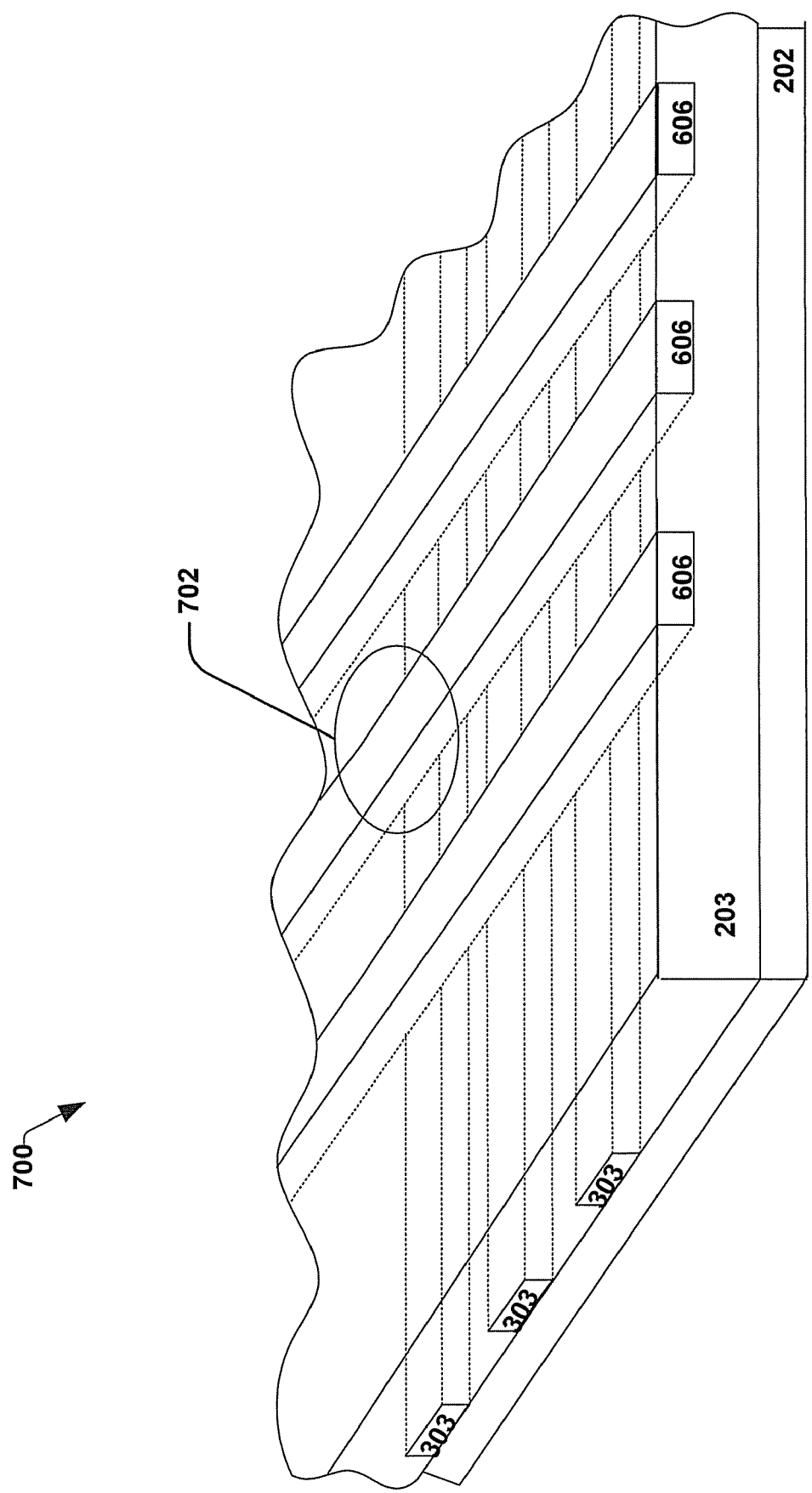
FIG. 7 illustrates an exemplary polymer memory device formed in accordance with one aspect of the present invention.
Figure 8:
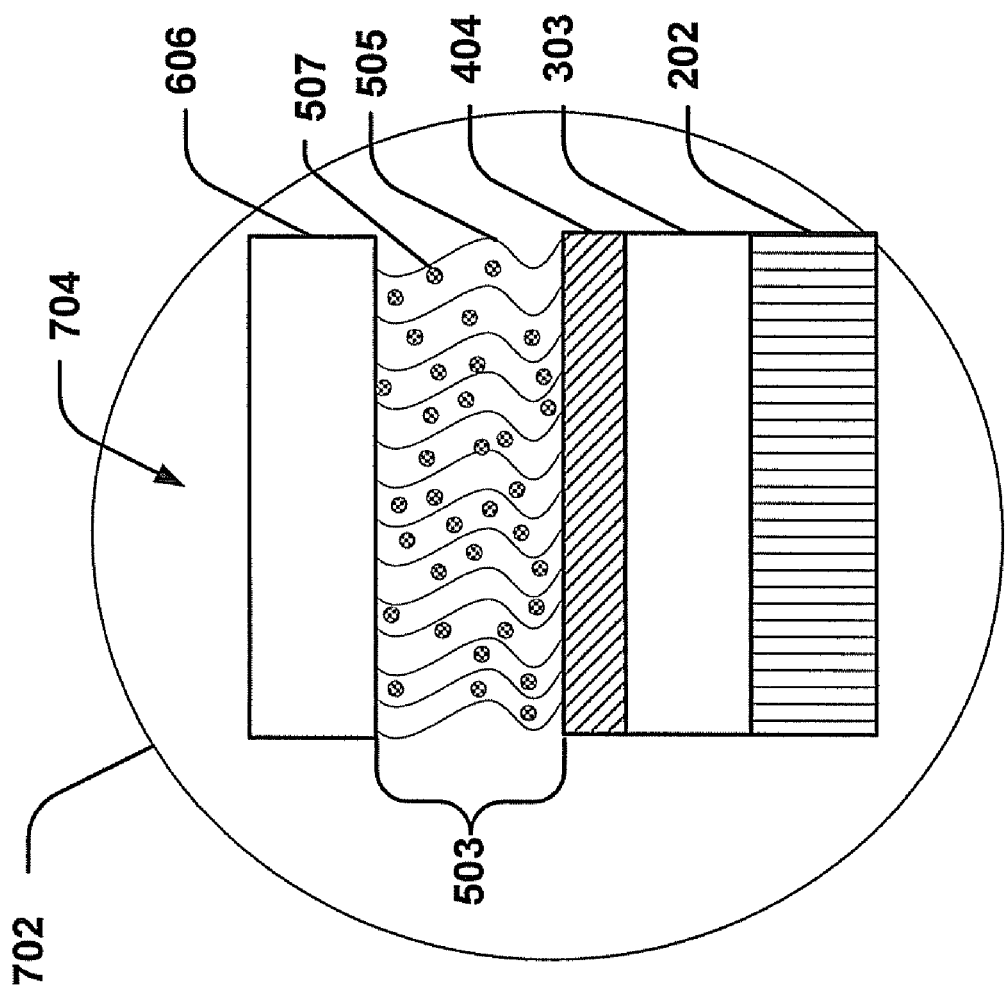
FIG. 8 illustrates an exploded cross-sectional view of an exemplary polymer memory cell as depicted in FIG. 7.

Referring to FIG. 7, a brief description of a microelectronic polymer memory device 700 containing a plurality of polymer memory cells positioned on or over a substrate 202 in accordance with one aspect of the invention is shown. The microelectronic polymer memory device 700 contains a desired number of polymer memory cells, as determined by the number of rows, columns, and layers (three dimensional orientation described later) positioned on a substrate 202. The polymer memory cells are formed in a dielectric 203. The first electrodes 303 and the second electrodes 606 are shown in substantially perpendicular orientation, although other orientations are possible to achieve the structure of the exploded view 702. An exploded view 702 of a polymer memory cell 704 shown in FIG. 8 and contains a substrate 202, a first electrode 303, an optional passive layer 404, and a second electrode 606 with a semiconducting polymer layer 503 therebetween. The semiconducting polymer layer 503 contains at least one semiconducting polymer 505 and at least one oxidation preventer 507. Peripheral circuitry and devices are not shown for brevity.

The substrate 202, the optional passive layer 404, electrodes 303 and 606, semiconducting polymer layer 503 containing polymer 503 and an oxidation preventer 507 have been described earlier and all the methods and materials described before can be used to manufacture device 700.

The dielectric 203 is formed by techniques known to one skilled in the art. Any suitable dielectric can be used as polymer dielectric 203. Both inorganic and organic dielectrics can be used.

In order to facilitate operation of the polymer memory cells 704, the semiconducting polymer layer 503 is thicker than the optional passive layer 404. In one embodiment, the thickness of the semiconducting polymer layer 503 is from about 10 to about 500 times greater than the thickness of the passive layer 404. In another embodiment, the thickness of the semiconducting polymer layer 503 is from about 25 to about 250 times greater than the thickness of the passive layer 404.

Operation of the polymer memory devices/cells is facilitated using an external stimuli to achieve a switching effect. The external stimuli include an external electric field and/or light radiation. Under various conditions, the polymer memory cell is either conductive (low impedance or "on" state) or non-conductive (high impedance or "off" state).

Either the semiconducting polymer layer 503 along with the optional passive layer 404 comprises the controllably conductive media or just the semiconducting polymer layer 503 comprises the controllably conductive media. The controllably conductive media can be rendered conductive or non-conductive in a controllable manner using an external stimuli. Generally, in the absence of an external stimuli, the controllably conductive media is non-conductive or has a high impedance. Further, in some embodiments, multiple degrees of conductivity/resistivity may be established for the controllably conductive media in a controllable manner. For example, the multiple degrees of conductivity/resistivity for the controllably conductive media may include a non-conductive state, a highly conductive state, a semiconductive state, and resistive state(s) with various levels of resistance (in other words, the controllably conductive media may have a plurality of conductive states).

Switching the polymer memory cell to the "on" state from the "off" state occurs when an external stimuli such as an applied electric field exceeds a threshold value. Switching the polymer memory cell to the "off" state from the "on" state occurs when an external stimuli does not exceed a threshold value or does not exist. The threshold value varies depending upon a number of factors including the identity of the materials that constitute the organic memory cell and the passive layer, the thickness of the various layers, and the like.

Generally speaking, the presence of an external stimuli such as an applied electric field that exceeds a threshold value ("programming" state) permits an applied voltage to write or erase information into/from the organic memory cell and the presence of an external stimuli such as an applied electric field that is less than a threshold value permits an applied voltage to read information from the polymer memory cell; whereas external stimuli that do not exceed a threshold value do not write or erase information into/from the organic memory cell.

To write information into the polymer memory cell, a voltage or pulse signal that exceeds the threshold is applied. To read information written into the polymer memory cell, a voltage or electric field of any polarity is applied. Measuring the impedance determines whether the organic memory cell is in a low impedance state or a high impedance state (and thus whether it is "on" or "off"). To erase information written into the polymer memory cell, a negative voltage opposite in polarity to the writing signal, that exceeds a threshold value, is applied.

The conductivity facilitating compound of the passive layer 404, when present, contributes to the controllably conductive properties of the controllably conductive media. The conductivity facilitating compound has the ability to donate and accept charges (holes and/or electrons) and/or act as a source of copper ions. When present, the passive layer 404 thus may transport holes, electrons, and/or ions between an electrode and the semiconducting polymer layer/passive layer interface, facilitate charge/carrier injection into the organic semiconducting polymer layer, and/or increase the concentration of a charge carrier (ions, holes and/or electrons) in the semiconducting polymer layer 503. In some instances, the passive layer 404 may store opposite charges thereby providing a balance of charges in the organic memory device as a whole. Storing charges/charge carriers is facilitated by the existence of two relatively stable oxidation states for the conductivity facilitating compound. The subject invention advantageously extends the duration of favorable charge/carrier status in the semiconducting polymer.

The fermi level of the optional passive layer 404 when present is close to the valence band of the semiconducting polymer layer 503. Consequently, the injected charge carrier (into the semiconducting polymer layer 503) may recombine with the charge at the passive layer 404 if the energy band of the charged semiconducting polymer layer 503 does not substantially change. Positioning energy bands involves compromising between ease of charge injection and length of charge (data) retention time. The subject invention extends the length of charge (data) retention time and thereby improves memory retention.

The methods and systems of improving memory characteristics of a polymer memory cell/device described in the subject invention are useful for any device requiring memory. For example, the semiconducting polymer devices with improved memory are useful in computers, appliances, industrial equipment, hand-held devices, telecommunications equipment, medical equipment, research and development equipment, transportation vehicles, radar/satellite devices, and the like. Hand-held devices, and particularly hand-held electronic devices, achieve improvements in portability due to the small size and light weight of the organic memory devices. Examples of hand-held devices include cell phones and other two way communication devices, personal data assistants, pagers, notebook computers, remote controls, recorders (video and audio), radios, small televisions and web viewers, cameras, and the like.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including any reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. A method for improving memory retention of a polymer memory cell comprising:
   providing a first electrode on a substrate and optionally forming a passive layer over the first electrode;
   forming a semiconducting polymer layer over the first electrode or the passive layer if present, the semiconducting polymer layer comprising a semiconducting polymer and at least one of 1) a carrier ion oxidation preventer and 2) an electrode oxidation preventer; and
   providing a second electrode over the semiconducting polymer layer,
   wherein the carrier ion/electrode oxidation preventer is one or more selected from a metal complex exhibiting oxygen scavenging activity, a Group IA element, an oxygen scavenger that is an organic compound, an oxygen scavenger that is an inorganic compound, an oxidizable compound, and an oxidizable polymer;
   wherein the semiconducting polymer is one or more selected from conjugated organic polymers, organometallic polymers, carbon nanotubes, and carbon buckyballs; and
   wherein the carrier ion/electrode oxidation preventer is present in an amount to react with oxygen or oxygen radicals to prevent or delay oxidation of carrier ions or carrier charges.

2. The method of claim 1, wherein the semiconducting polymer layer comprises from about 0.001 to about 1% by weight of the carrier ion oxidation preventer and from about 99.9 to about 99% by weight of the semiconducting polymer.

3. The method of claim 1, wherein the carrier ion/electrode oxidation preventer comprises at least one oxygen scavenger.

4. The method of claim 1, wherein the carrier ion/electrode oxidation preventer comprises lithium metal.

5. The method of claim 4, wherein the lithium metal is incorporated into the semiconducting polymer layer using at least one of implantation and diffusion.

6. The method of claim 4, wherein the semiconducting polymer layer comprises from about 0.001 to about 10% by weight of the lithium metal and from about 99.999 to about 90% by weight of the semiconducting polymer.

7. The method of claim 1, wherein the carrier ion/electrode oxidation preventer comprises nanoparticles of lithium metal.

8. The method of claim 7, wherein the nanoparticles of lithium metal have a diameter size from about 1 nm to about 500 nm.

9. The method of claim 1, wherein the carrier ion/electrode oxidation preventer is selected from the group consisting of hydrazine, hydroxylamine, sodium azide, sodium sulfite, polyterpenes, ascorbic acid, and polycarboxylic acid.

10. The method of claim 1, wherein the oxidizable compound comprises at least one of sulfur dioxide, sodium sulfite, sodium metabisulfite, anhydrous sodium bisulfite, potassium metabisulfite, anhydrous potassium bisulfite, lithium aluminum hydride, sodium borohydride, and diborane.

11. The method of claim 1, wherein the oxidizable compound comprises at least one selected from the group consisting of oxidizable polymers containing aliphatic unsaturated hydrocarbons and polymers with oxidizable side-chain groups, wherein the oxidizable side-chain groups are one or more selected from the group consisting of esters, carboxylic acids, aldehydes, ethers, ketones, alcohols, peroxides, and hydroperoxides.

12. The method of claim 11, wherein the oxidizable polymer is incorporated into the semiconducting polymer layer using at least one of co-polymerization, implantation and diffusion.

13. A method for improving memory retention of a polymer memory cell comprising:
providing a first electrode on a substrate and optionally forming a passive layer over the first electrode;
forming a semiconducting polymer layer over the first electrode or the passive layer if present, the semiconducting polymer layer comprising a semiconducting polymer and at least one of 1) a carrier ion oxidation preventer and 2) an electrode oxidation preventer; and
providing a second electrode over the semiconducting polymer layer,
wherein the semiconducting polymer comprises one or more selected from the group consisting of conjugated organic polymers, organometallic polymers, carbon nanotubes, and carbon buckyballs.

14. The method of claim 13, wherein the semiconducting polymer is a conjugated organic polymer selected from one of the group consisting of poly(p-phenylene vinylene); polyporphyrins; porphyrinic macrocycles, thiol-derivatized polyporphyrins; polymetallocenes such as polyferrocenes, polyphthalocyanines; polyvinylenes; polystiroles; polyacetylene; polydiphenylacetylene; poly(t_butyl)diphenylacetylene; poly(trifluoromethyl)diphenylacetylene; polybis(trifluoromethyl)acetylene; polybis(t-butyldiphenyl)acetylene; poly(trimethylsilyl)diphenylacetylene; poly(carbazole)diphenylacetylene; polydiacetylene; polyphenylacetylene; polypyridineacetylene; polymethoxyphenylacetylene; polymethylphenylacetylene; poly(t-butyl)phenylacetylene; polynitro-phenylacetylene; poly(trifluoromethyl)phenylacetylene; poly(trimethylsilyl)pheylacetylene; polydipyrrylmethane; polyindoqiunone; polydihydroxyindole; polytrihydroxyindole; furane-polydihydroxyindole; polyindoqiunone-2-carboxyl; polyindoqiunone; polybenzobisthiazole; poly(p-phenylene sulfide); polyaniline; polythiophene; polypyrrole; polysilane; polystyrene; polyfuran; polyindole; polyazulene; polyphenylene; polypyridine; polybipyridine; polyphthalocyanine; polysexithiofene; poly(siliconoxohemiporphyrazine); poly(germaniumoxohemiporphyrazine); poly(ethylenedioxythiophene); polymetallocene complexes of Fe, V, Cr, Co, or Ni; and polypyridine metal complexes or Ru and Os.

15. The method of claim 13, wherein the carrier ion/electrode oxidation preventer comprises lithium metal.

16. The method of claim 13, wherein the carrier ion/electrode oxidation preventer comprises nanoparticles of lithium having a diameter size from about 1 nm to about 500 nm.

17. The method of claim 13, wherein the carrier ion/electrode oxidation preventer is selected from the group consisting of hydrazine, hydroxylamine, sodium azide, sodium sulfite, polyterpenes, ascorbic acid, and polycarboxylic acid.

18. The method of claim 13, wherein the carrier ion/electrode oxidation preventer comprises an oxidizable compound selected from at least one of the group consisting of sulfur dioxide, sodium sulfite, sodium metabisulfite, anhydrous sodium bisulfite, potassium metabisulfite, anhydrous potassium bisulfite, lithium aluminum hydride, sodium borohydride, and diborane.

19. The method of claim 13, wherein the carrier ion/electrode oxidation preventer comprises at least one selected from the group consisting of oxidizable polymers containing aliphatic unsaturated hydrocarbons and polymers with oxidizable side-chain groups, wherein the oxidizable side-chain groups are one or more selected from the group consisting of esters, carboxylic acids, aldehydes, ethers, ketones, alcohols, peroxides, and hydroperoxides.

* * * * *